United States Patent [19]
Yamazaki et al.

[11] Patent Number: 5,650,338
[45] Date of Patent: Jul. 22, 1997

[54] METHOD FOR FORMING THIN FILM TRANSISTOR

[75] Inventors: Shunpei Yamazaki, Tokyo; Hongyong Zhang, Kanagawa; Hideki Uochi, Kanagawa; Hiroki Adachi, Kanagawa; Yasuhiko Takemura, Kanagawa, all of Japan

[73] Assignee: Semiconductor Energy Laboratory Co., Ltd., Kanagawa, Japan

[21] Appl. No.: 216,277

[22] Filed: Mar. 23, 1994

Related U.S. Application Data

[63] Continuation-in-part of Ser. No. 933,810, Aug. 24, 1992, Pat. No. 5,308,998.

[30] Foreign Application Priority Data

| Aug. 26, 1991 | [JP] | Japan | 3-238713 |
| Jan. 21, 1992 | [JP] | Japan | 4-30220 |
| Mar. 24, 1993 | [JP] | Japan | 5-089118 |
| Mar. 24, 1993 | [JP] | Japan | 5-089119 |

[51] Int. Cl.⁶ ............................................. H01L 21/84
[52] U.S. Cl. .................. 437/21; 437/41; 437/170; 437/174
[58] Field of Search ............... 205/123, 171, 205/221, 229; 437/21, 41, 101, 909, 173, 170, 174

[56] References Cited

U.S. PATENT DOCUMENTS

| 3,775,262 | 11/1973 | Heyerdahl . |
| 3,862,017 | 1/1975 | Tsunemitsu et al. . |
| 4,230,539 | 10/1980 | Saruwatari et al. . |
| 4,727,044 | 2/1988 | Yamazaki .................. 437/45 |
| 5,132,200 | 7/1992 | Fukuda et al. . |
| 5,142,344 | 8/1992 | Yamazaki et al. . |
| 5,202,274 | 4/1993 | Bae et al. . |
| 5,289,030 | 2/1994 | Yamazaki et al. . |
| 5,308,998 | 5/1994 | Yamazaki et al. ............ 257/57 |
| 5,424,244 | 6/1995 | Zhang et al. . |

FOREIGN PATENT DOCUMENTS

| 0072216 | 2/1983 | European Pat. Off. . |
| 55-131197A | 10/1980 | Japan .................. 205/229 |
| 59-197595A | 11/1984 | Japan .................. 205/171 |
| 3-34433 | 2/1991 | Japan . |

OTHER PUBLICATIONS

Wolf, "Silicon Processing for the VLSI Era, Volume II: Process Integration", Lattice Press, pp. 66–67 1990 month unknown.

*Primary Examiner*—John Niebling
*Assistant Examiner*—Richard A. Booth
*Attorney, Agent, or Firm*—Sixbey, Friedman, Leedom & Ferguson, PC; Gerald J. Ferguson, Jr.; Jeffrey L. Costellia

[57] ABSTRACT

In film forming of thin film semiconductors (TFTs), a gate electrode having an anodic-oxidizable material is formed on a substrate, and the surface of the gate electrode is oxidized by anodic oxidation in an electrolytic solution so that the surface of the gate electrode is coated with an insulating film. The doping is performed using the gate electrode and the anodic oxide film as a mask, to form a source and a drain region. Then, when the laminate is again dipped in an electrolytic solution, and a voltage is applied to the gate electrode so that a current curing produces in the laminate. During the current curing, a positive voltage is preferably applied to the gate electrode for N-channel TFTs and a negative voltage is preferably to the gate electrode for P-channel TFTs. After the doping, the source and the drain region is activated by laser annealing or the like, prior to the current curing.

22 Claims, 9 Drawing Sheets

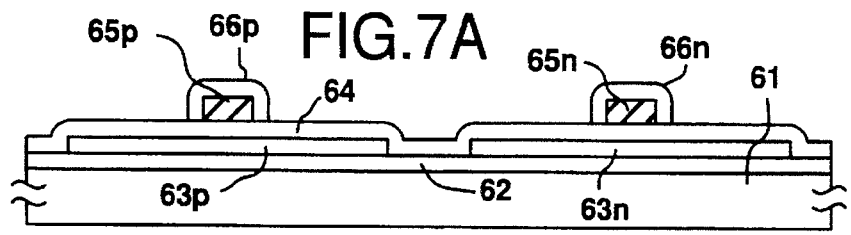
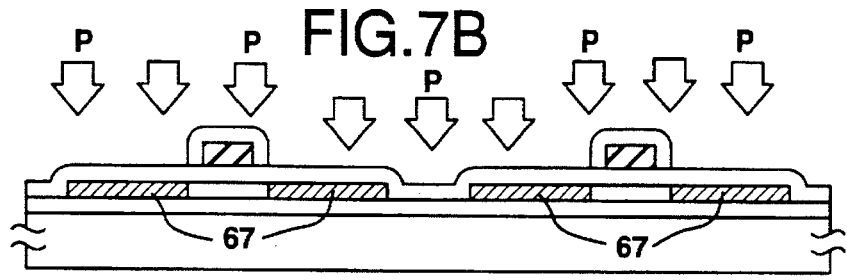
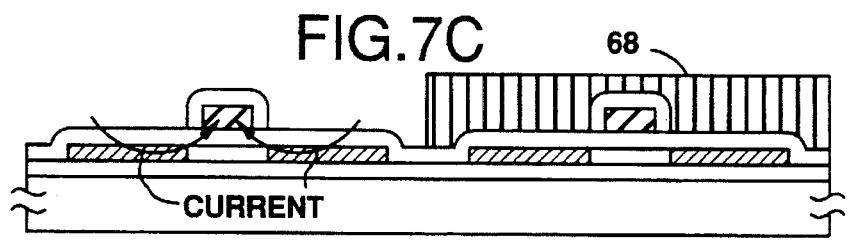
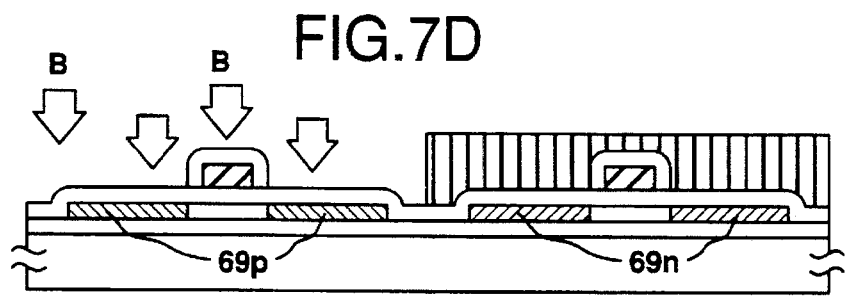
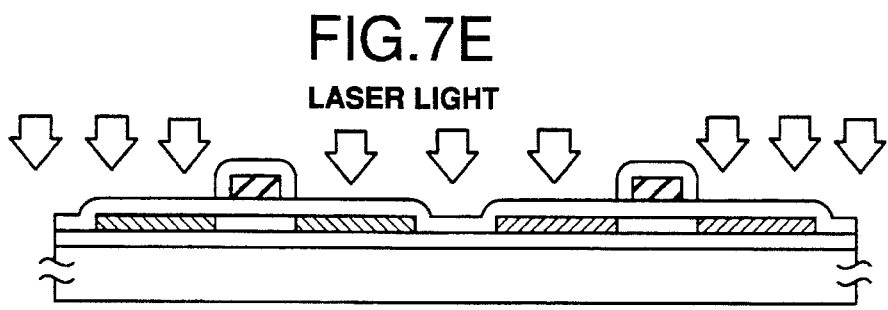
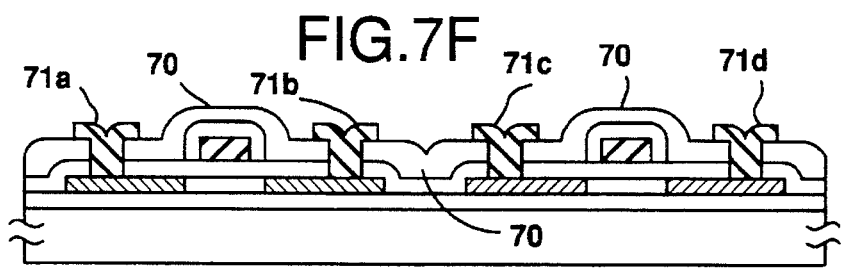

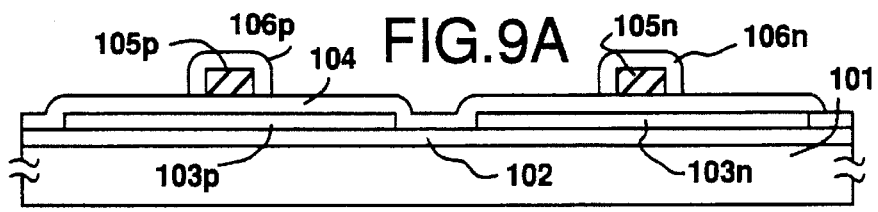
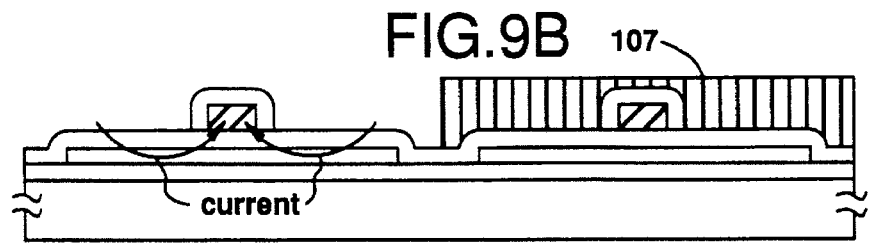
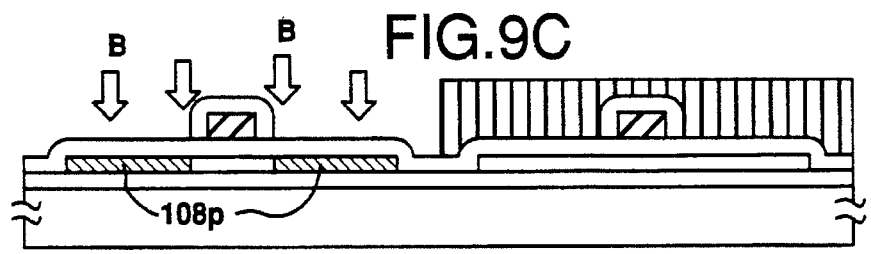
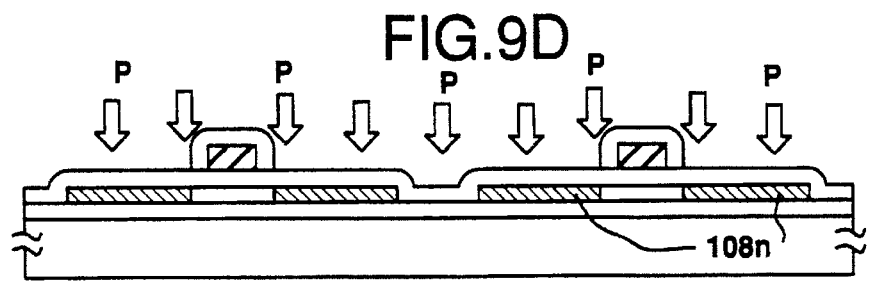
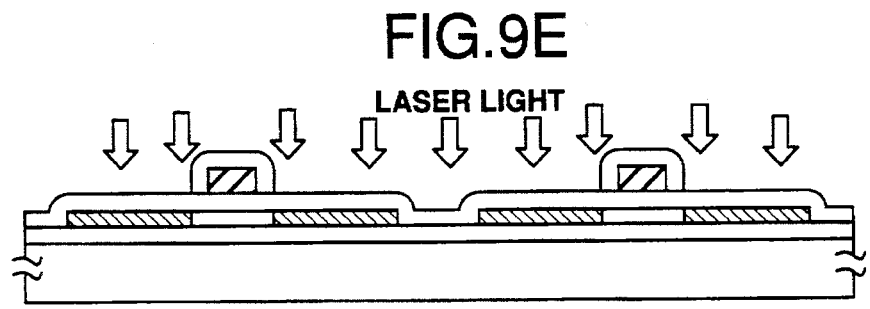
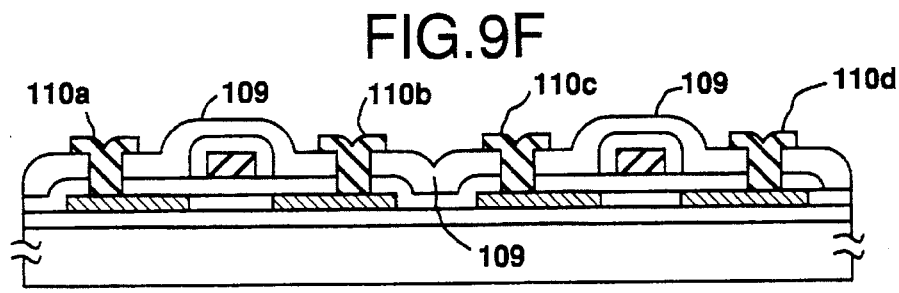

METHOD FOR FORMING THIN FILM TRANSISTOR

This is a continuation in part of Ser. No. 07/933,810, filed Aug. 24, 1992, now U.S. Pat. No. 5,308,998.

BACKGROUND OF THE INVENTION

1. Field of the Invention

The present invention relates to a method for forming a thin film transistor (TFT) having a non-single crystalline semiconductor film. The thin film transistor according to the present invention may be formed on any of insulating substrates such as glass substrate or the like and semiconductor substrates such as non-single crystalline silicon substrate or the like.

2. Description of the Related Art

Recently, insulated gate type semiconductor devices having an active layer (referred to as an active region) of a thin film on an insulating substrate have been studied. In particular, insulated gate transistors of a thin film, or so called thin film transistors (TFTs), have been studied assiduously. These are grouped into amorphous silicon TFTs and crystalline silicon TFTs, depending on the semiconductor materials to be used and the crystal conditions of the materials.

Crystalline semiconductors have a larger field mobility than amorphous semiconductors and therefore may be adapted to high speed operation. Using a crystalline silicon, since not only NMOS TFTs but also PMOS TFTs are formed, CMOS circuits can be obtained. For these reasons, TFTs using crystalline silicons have been studied generally in these days.

From the technical results up to this time, an insulated gate film of a silicon oxide to be formed by thermal oxidation has the most preferred characteristics in a case wherein such insulated gate type devices (elements) are fabricated. However, in order to obtain the thermal oxide film, heat treatment at temperatures of around 1000° C. is needed. Such temperatures limit the substrate materials to be used. Therefore, for forming such TFTs, insulating films to be formed by sputtering or various chemical vapor deposition (CVD) methods are used.

Since the formation of these insulating films does not need such high temperatures, it solved the limitation of the usable substrates. On the other hand, however, the insulating films to be formed by such chemical vapor deposition methods are found to involve other problems that they have a high interfacial level density and have many defects such as pin holes, etc. In repairing the defects and improving the characteristics of the films, the film cannot be treated after the film forming and the optimal film forming conditions are the only one manner to solve the problems at present. The present invention has been made in consideration of the current situations in this technical field, and it provides a method for forming TFTs having improved characteristics by repairing the insulating film after its film forming and improving the characteristics of the interface between the insulating film and a semiconductor or between the insulating film and a gate electrode material.

SUMMARY OF THE INVENTION

Accordingly, the first aspect of the present invention is to provide a method for forming a thin film transistor, comprising the steps of: forming a non-single crystalline semiconductor region having an island shape on a substrate; forming an insulating film covering the non-single crystalline semiconductor region; forming a gate electrode comprising an anode-oxidizable material on the insulating film, to obtain a first laminate; dipping the first laminate in an electrolytic solution and applying an electric current to the gate electrode as a positive electrode, to form an anodic oxide film on a surface of the gate electrode; introducing an impurity into the non-single crystalline semiconductor region using the gate electrode and the anodic oxide film as masks, to obtain a second laminate; and dipping the second laminate in the electrolytic solution and applying a positive or negative voltage to the gate electrode.

The second aspect of the present invention is to provide a method for forming thin film transistors, comprising the steps of: forming at least two non-single crystalline semiconductor regions each having an island shape on a substrate; forming an insulating film covering the non-single crystalline semiconductor regions; forming gate electrodes each comprising an anode-oxidizable material on the insulating film, to obtain a first laminate; dipping the first laminate in an electrolytic solution and applying an electric current to the gate electrodes as positive electrodes, to form anodic oxide films on surfaces of the gate electrodes; forming an insulating material as a mask over at least one of the non-single crystalline semiconductor regions; introducing an impurity into at least one of the non-single crystalline semiconductor regions over which the insulating material has not formed, to obtain a second laminate; dipping the second laminate in the electrolytic solution and applying a positive or negative voltage to the gate electrodes; and removing the insulating material.

The third aspect of the present invention is to provide a method for forming thin film transistors, comprising the steps of: forming on a substrate at least one first non-single crystalline semiconductor region having an island shape for an N-channel thin film transistor and at least one second non-single crystalline semiconductor region having an island shape for a P-channel thin film transistor; forming an insulating film covering the first and second non-single crystalline semiconductor regions; forming gate electrodes each comprising an anode-oxidizable material on the insulating film, to obtain a first laminate; dipping the first laminate in an electrolytic solution and applying an electric current to the gate electrodes as positive electrodes, to form anodic oxide films on surfaces of the gate electrodes; forming a first mask comprising an insulating material over one of the first and second non-single crystalline semiconductor regions; introducing an impurity into the other one of the first and second non-single crystalline semiconductor regions over which the first mask has not formed, to obtain a second laminate; dipping the second laminate in an electrolytic solution and applying a positive or negative voltage to the gate electrodes; removing the first mask; forming a second mask comprising an insulating material over the other one of the first and second non-single crystalline semiconductor regions over which the first mask has not formed; introducing an impurity into the one of the first and second non-single crystalline semiconductor regions over which the second mask has not formed, to obtain a third laminate; dipping the third laminate in an electrolytic solution and applying to the gate electrodes a voltage having a polarity which is opposite to a polarity of the voltage applied to the gate electrodes after the second laminate is dipped in the electrolytic solution; and removing the second mask.

The forth aspect of the present invention is to provide a method for forming thin film transistors, comprising the steps of: forming on a substrate at least one first non-single crystalline semiconductor region having an island shape for an N-channel thin film transistor and at least one second non-single crystalline semiconductor region having an island shape for a P-channel thin film transistor; forming an insulating film covering the first and second non-single crystalline semiconductor regions; forming gate electrodes each comprising an anode-oxidizable material on the insulating film, to obtain a first laminate; dipping the first laminate in an electrolytic solution and applying an electric current to the gate electrodes as positive electrodes, to form anodic oxide films on surfaces of the gate electrodes; doping an impurity for providing N-conductivity type into the first and second non-single crystalline semiconductor regions; forming a mask comprising an insulating material over the first non-signal crystalline semiconductor region, to obtain a second laminate; dipping the second laminate in an electrolytic solution; and applying a negative voltage to the gate electrodes.

The fifth aspect of the present invention is provide a method for forming thin film transistors, comprising the steps of: forming on a substrate at least one first non-single crystalline semiconductor region having an island shape for an N-channel thin film transistor and at least one second non-single crystalline semiconductor region for a P-channel thin film transistor; forming an insulating film covering the first and second non-single crystalline semiconductor regions; forming gate electrodes each comprising an anode-oxidizable material on the insulating film, to obtain a first laminate; dipping the first laminate in an electrolytic solution and applying an electric current to the gate electrodes as positive electrodes, to form anodic oxide films on surfaces of the gate electrodes; forming a mask comprising an insulating material over the first non-signal crystalline semiconductor region, to obtain a second laminate; dipping the second laminate in an electrolytic solution; applying a negative voltage to the gate electrodes; and doping an impurity for providing N-conductivity type into the first and second non-single crystalline semiconductor regions.

BRIEF DESCRIPTION OF THE DRAWINGS

FIGS. 7A to 7F show process views explaining the TFT to be produced in Embodiment 4;

FIGS. 9A to 9F show process views explaining the TFT to be produced in Embodiment 6.

DETAILED DESCRIPTION OF THE PREFERRED EMBODIMENT

The present inventors have found, from our studies, that the characteristics of thin film transistors (TFTs) are extremely improved when a positive or negative voltage is applied between the gate electrode and the semiconductor layer via the gate insulating film. The effect will be referred to as a current curing or a current annealing. It is required to supply a desired voltage in order to produce the current curing effect. For instance, for N-channel type TFTs (where the source and the drain each have N-type), a positive voltage must be supplied to the gate electrode. If not, or if a negative voltage is supplied thereto, the characteristics of the TFTs cannot be improved. For, P-channel type TFTs (where the source and the drain each have P-type), a negative voltage is preferably supplied to the gate electrode.

One reason of such the current curing effect is because the pin holes in the oxide film such as a gate insulating film are filled up due to the electrochemical effect. Precisely, if the thickness of the gate insulating film is uneven, ions (oxygen ions as main ions) are moved so as to smooth the uneven part due to the applied voltage. As a result, the evenness of the gate insulating film in TFTs is improved.

The other reason is such that the heat to be generated by the applied current produces substantially the same effect as the effect by high temperature annealing. Precisely, all the fixed charges are completely removed while ions suitable for dangling bonds are bonded to the dangling bonds of silicon thereby to reduce the interfacial level density. If such is applied to the whole of the substrate, high temperatures of around 1000° C. are needed. In the current curing, however, the whole of the substrate may be treated at room temperature or while cooling, while it is microscopically observed that the small region of the gate insulating film is treated with an energy amount (about 0.1 eV) corresponding to 1000° C.

Figure 1A:
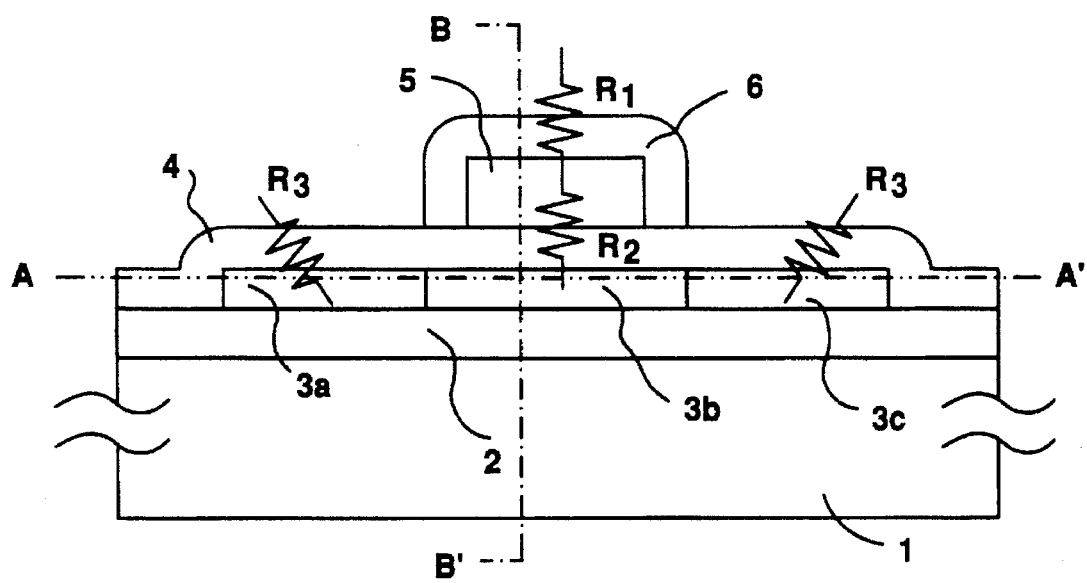
FIGS. 1A and 1B show conceptual views of the present invention.

FIG. 1A shows a basic structure of a TFT. In FIG. 1A, the TFT comprises a substrate 1, a base insulating film 2, an island semiconductor region (comprised of a source 3a, an active region 3b and a drain 3c) a gate insulating film 4 and a gate electrode 5. An insulating film 8 is formed around the gate electrode 5.

Figure 2A:
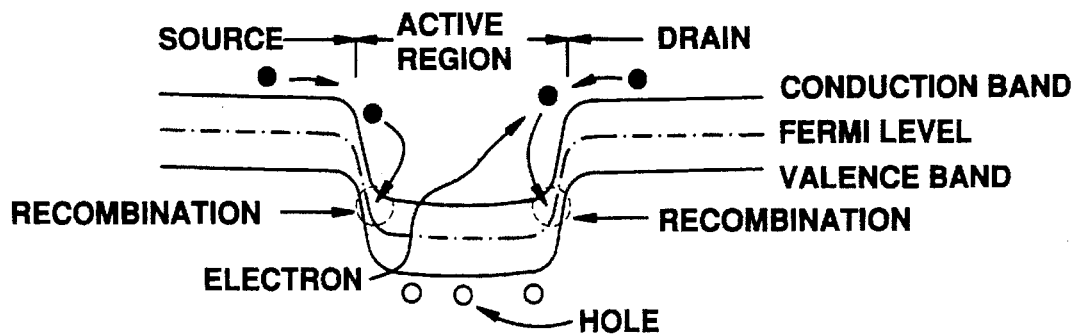
FIGS. 2A to 2D show band diagrams explaining conditions of current curing.
Figure 2B:
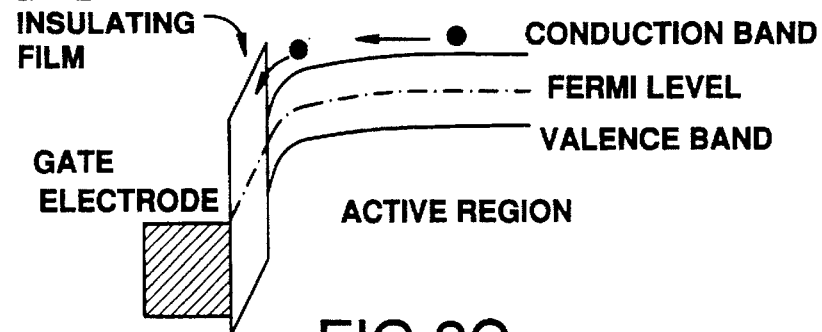
Figure 2C:
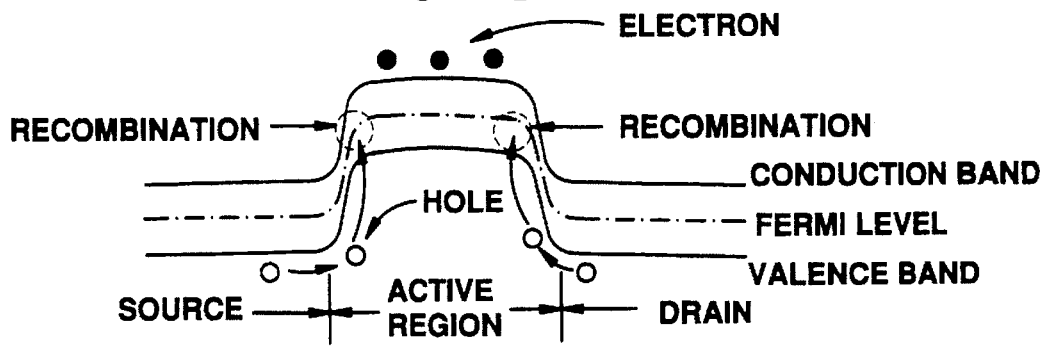
Figure 2D:
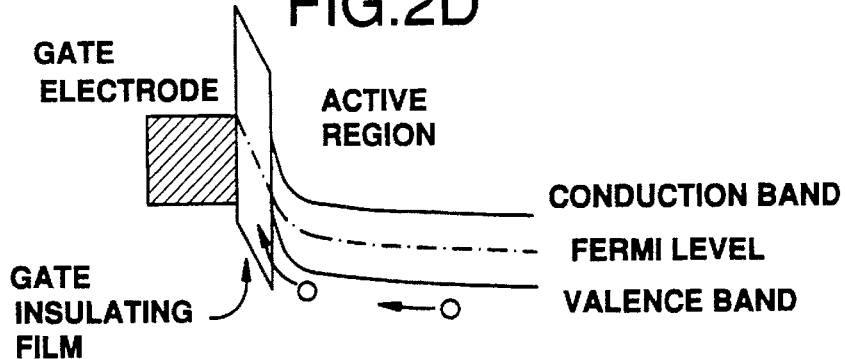

FIGS. 2A to 2D show states of the TFT when the source 3a and the drain 3c have the same potential and a voltage is applied between these 3a and 3b and the gate electrode 5. FIGS. 2A and 2C show the energy band diagrams along the line A–A' in FIG. 1A. FIGS. 2B and 2D show the energy band diagrams along the line B–B' in FIG. 1A. In FIGS. 2A and 2B, a positive voltage is applied to the gate electrode 5 in N-channel TFTs. In FIGS. 2C and 2D, a negative voltage is applied to the gate electrode 5 in P-channel TFTs. As shown in these figures, the energy bands are rapidly curved in the vicinities of the gate electrode 5 and the gate insulating film 4 due to the influence of the applied voltage, whereby a deep inversion is formed in the vicinity of the silicon in an interface between the silicon oxide and the silicon. Accordingly, electrons and holes (positive holes) are accelerated in the area where the energy bands are steeply curved and are recombined together therein via the recombination centers, as shown in FIGS. 2A and 2C. After that, these lose the kinetic energy due to the recombination and locally generate a heat energy, to thereby recombine and neutralize the dangling bonds. As shown in FIGS. 2B and 2D, electrons or holes move rapidly from the inside of the semiconductor into the gate insulating film via the interface therebetween, while they still have a high energy. Then, the electrons or holes collide against the lattices, thereby to locally generate a great heat.

The above mentioned effect has been clearly ascertained in the experimental work. However, mass production is extreme difficulty. One essential problem is how to apply the voltage to the semiconductor region and the gate electrode.

In the experimental work, the gate electrode and the semiconductor region may be connected with a wire. However, such is not a realistic plan for mass production. Regarding the problem, the present inventors have found that the problem may be solved by employing a room temperature or cooled electrolytic solution. The solution has a function as a cool sink (coolant) that prevents the too strong local heating which produces permanent breakage of the substrate. For instance, in the TFT as shown in FIG. 1A. The insulating film 6 which is formed around the gate electrode 5 is extremely important when an electrolytic solution is used. In general, the insulating film 6 is preferably an oxide film to be obtained by anodic oxidation of the gate electrode 5.

Though only one TFT is shown in FIG. 1A, a number of such TFT are independently on the same substrate. Current curing may be effected by applying an voltage to the gate electrode to cause a difference in the potential between the upper portion and the lower portion of the gate insulating film.

Figure 1B:
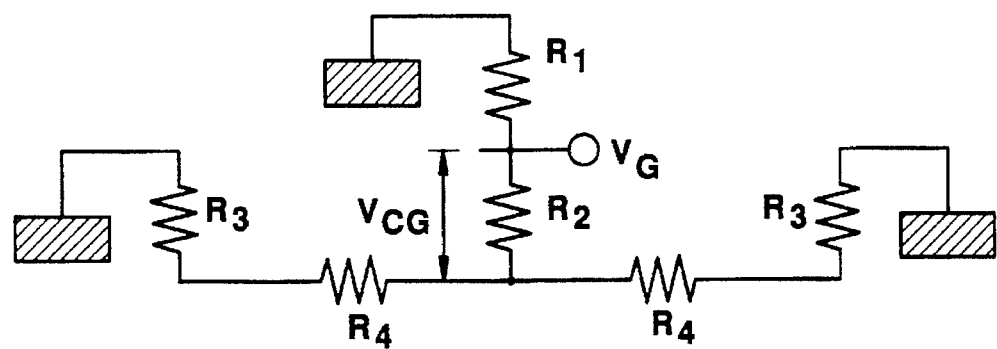

The equivalent circuit of the TFT of FIG. 1A is shown in FIG. 1B. A potential of the gate electrode 5 is $V_G$. Seeing the circuit from the side of the gate electrode 5, there are two current routes. One is a route to the electrolytic solution through the insulating film 6 (having a resistance of $R_1$) and the other is to the electrolytic solution through the gate insulating film 4 (having a resistance of $R_2$) below the gate electrode 5, the semiconductor region (including the source, the drain and the active region and having a resistance of $R_4$) and the gate insulating film 4 (having a resistance of $R_3$). By controlling these resistances $R_1$, $R_2$, $R_3$ and $R_4$, the value of the voltage $V_{CG}$ to be applied to the gate insulating film 4 below the gate electrode 5 may be changed and optimized.

If the insulating film 6 is not in the TFT, $R_1=0$ and $V_{CG}=0$ so that a voltage is not applied to the gate insulating film 4. Therefore, the insulating film 6 requires in the TFT of the present invention. As can be seen from the circuit, when $R_1 < R_2+R_3+R_4$, then $V_{CG}$ is to be smaller than the voltage to be applied to the insulating film 6. From experiments, it has been clarified that the value of $V_{CG}$ must be from 30 to 80 V. In order to obtain such a high voltage, it is desired to increase $R_1$ and to reduce $R_4$.

As concrete terms, the source 3a and the drain 3b in the semiconductor region may be doped using an impurity, to reduce their resistance. After the doping, it is preferred to activate the impurity to further reduce their resistance, whereby a more favorable result may be obtained by the current curing. It is also effective to thicken the insulating film 6. As a result, an effective current curing may be conducted without increasing so much the voltage $V_G$ to be applied to the gate electrode. In order to effectively conduct the current curing, a positive voltage is applied to an N-channel type TFT and a negative voltage is applied to a P-channel type TFT.

Also, for instance, in the anodic oxidation process, $R_1$ becomes large with the growth of the insulating film 6. When $R_1$ has become large to a certain degree to be equivalent to $R_2$, $R_3$ and $R_4$, $V_{CG}$ becomes suddenly large.

As a result, the current curing may be conducted even during the anodic oxidation. In particular, since a positive voltage is applied to the gate electrode during the current curing, a favorable result may be obtained in producing N-channel TFTs. However, CMOS circuits (or CTFT circuits) may have P-channel TFTs in addition to N-channel TFTs. Since an unfavorable voltage is applied to P-channel TFTs in the anodic oxidation process, it is necessary to apply a negative voltage to only the P-channel TFTs so as to repair the P-channel TFTs by current curing. In this case, however, it is unfavorable to apply the negative voltage to N-channel TFTs.

To avoid such difficulty, it will be general to separately form gate electrodes for the P-channel TFT and the N-channel TFT in order that a voltage is independently applied thereto. However, connection of the gate electrode of the N-channel TFT with that of the P-channel TFT is frequently required in the circuit of CTFT. Therefore, if the application of the voltage to these gate electrodes is separately conducted by independent lines, an additional pattern for connecting them later is needed.

The present invention has solved the difficulty in the independent applications of the voltage to the gate electrodes, and its technical idea is characterized in that N-channel TFTs are masked with an insulating mask during the current curing of P-channel TFTs in order that any effective voltage is not applied to the gate insulating film of N-channel TFTs. In particular, the mask to be used for this purpose may not be any special mask but the doping mask for P-channel TFTs may be used, without increasing processes, or conducting additional processes.

Accordingly, doping of a P-type impurity is preferably conducted before and/or after the current curing. In view of the above mentioned technical idea, the present invention includes various variations. The basic process of the present invention is composed of the following five processes:

(1) Anodic oxidation of all gate electrodes (current curing of N-channel TFTs).

(2) Doping of an N-type impurity (into the whole surface).

(3) Forming of masks for P-channel TFTs.

(4) Current curing of P-channel TFTs.

(5) Doping of a P-type impurity.

The first process (start process) of the present invention is the process (1) which may be followed by variations comprising the other processes (2) to (5). The following patterns may be taken into consideration, all of which are practicable.

| (A) | (1) | → | (2) | → | (3) | → | (4) | → | (5) |
| (B) | (1) | → | (2) | → | (3) | → | (5) | → | (4) |
| (C) | (1) | → | (3) | → | (4) | → | (5) | → | (2) |
| (D) | (1) | → | (3) | → | (5) | → | (4) | → | (2) |

If an anodic oxide of the gate electrode material is to be used as the insulating film 6, aluminum, tantalum, silicon, titanium, tungsten, chromium or the like may be used as the gate electrode 5. It is desired that the electrolytic solution is maintained at a constant temperature so as to uniformly carry out the reaction. The present invention is characterized by using the electrolytic solution. Cooling (by thermal diffusion) of the substrate is easy by using the electrolytic solution, so that local over-heating of the substrate to cause its breakage may be prevented.

Figure 3A:
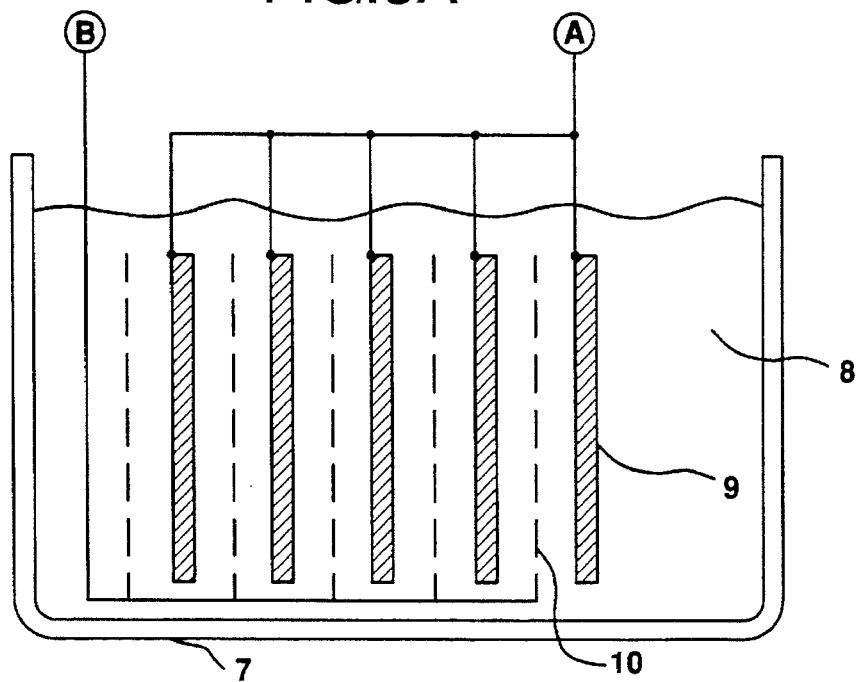
FIGS. 3A and 3B show a device for current curing or anode-oxidation.
Figure 3B:
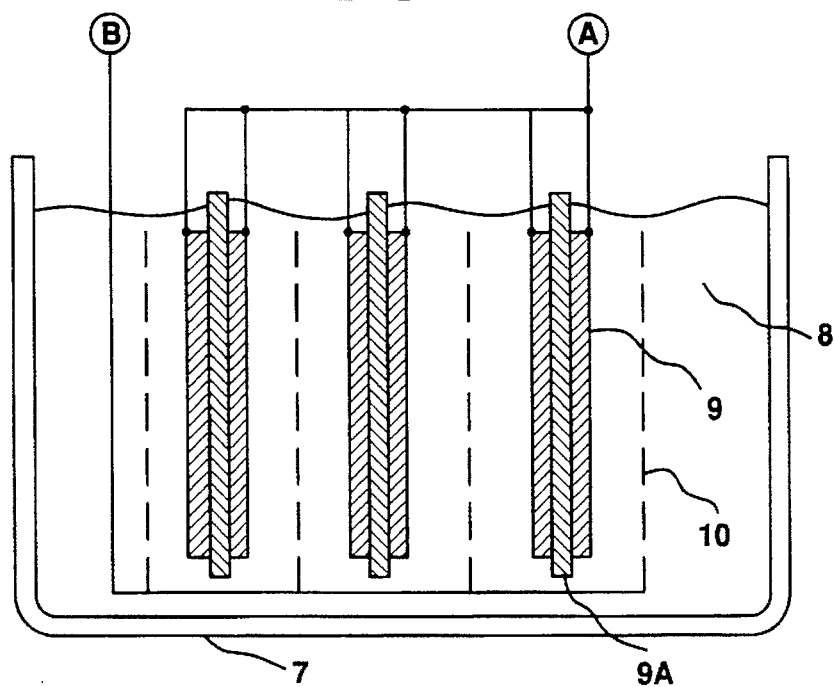
Figure 4A:
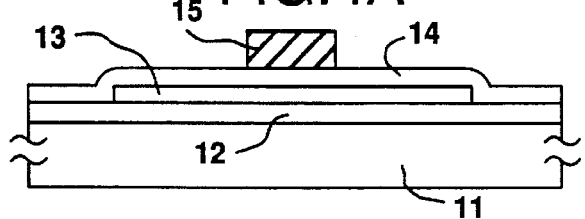
FIGS. 4A to 4F show process views explaining the TFT to be produced in Embodiment 1.
Figure 4B:
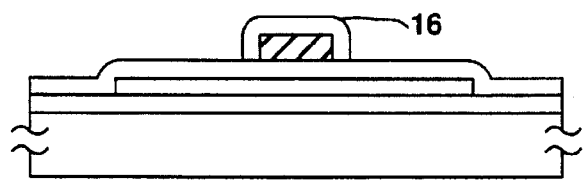
Figure 4C:
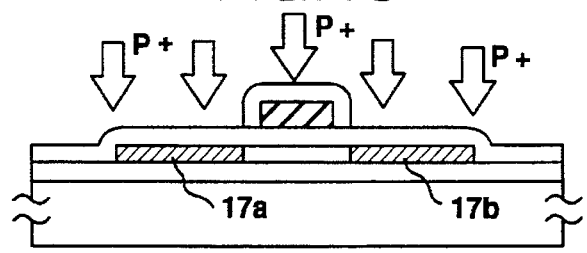
Figure 4D:
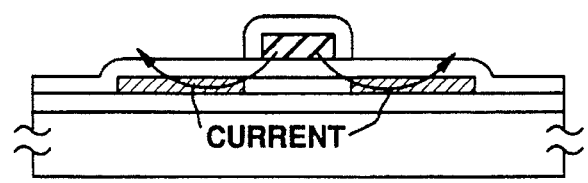
Figure 4E:
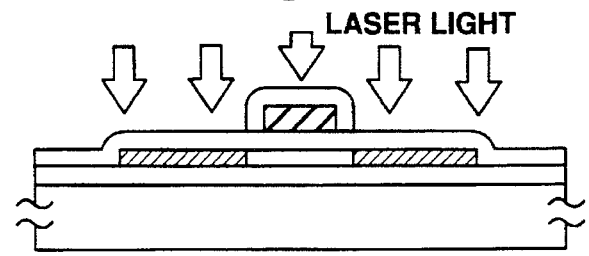
Figure 4F:
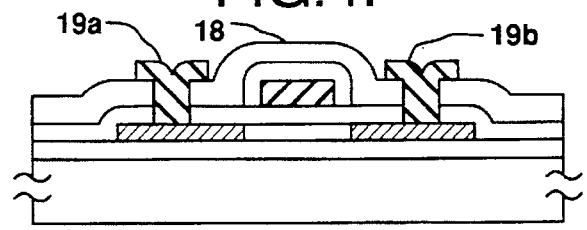
Figure 5A:
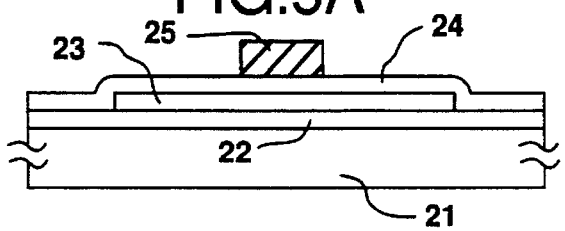
FIGS. 5A to 5F show process views explaining the TFT to be produced in Embodiment 2.
Figure 5B:
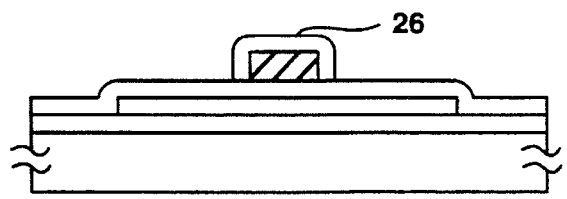
Figure 5C:
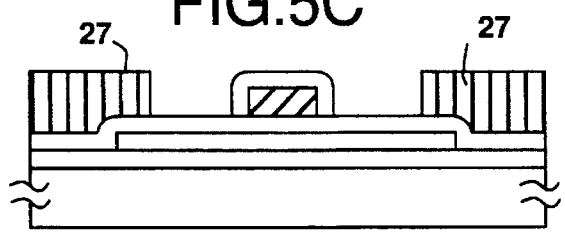
Figure 5D:
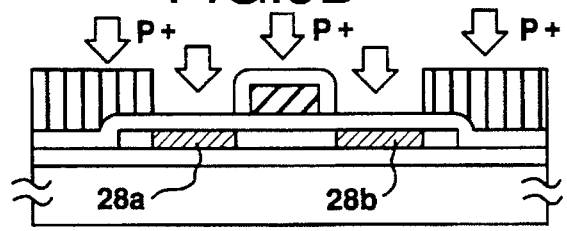
Figure 5E:
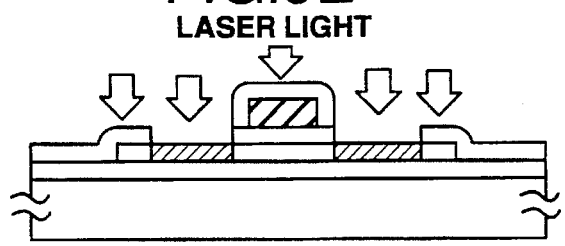
Figure 5F:
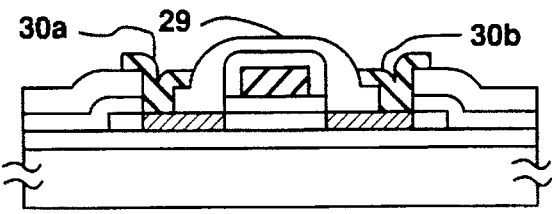
Figure 6A:
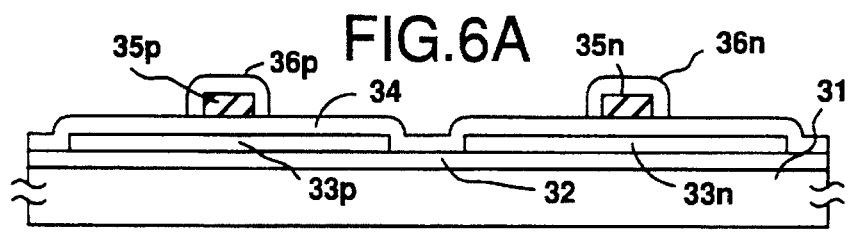
FIGS. 6A to 6F show process views explaining the TFT to be produced in Embodiment 3.
Figure 6B:
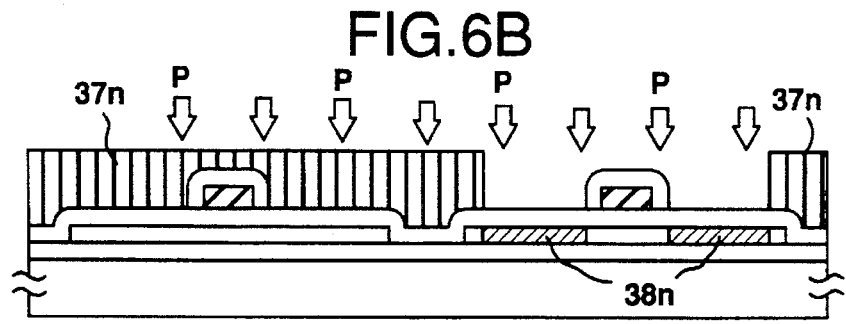
Figure 6C:
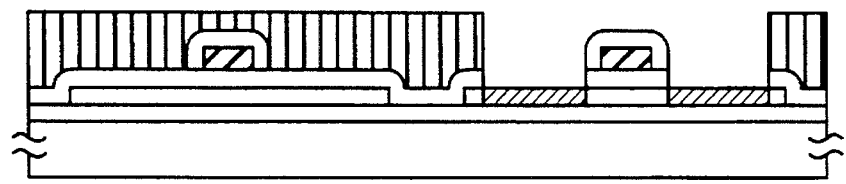
Figure 6D:
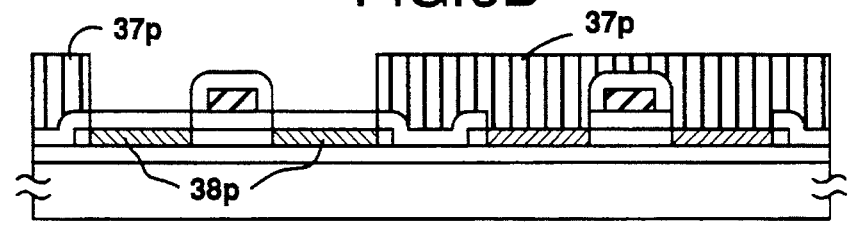
Figure 6E:
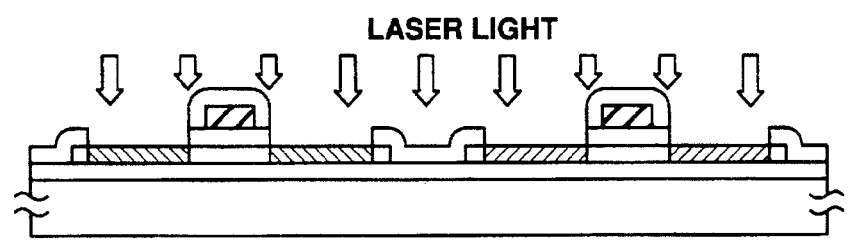
Figure 6F:
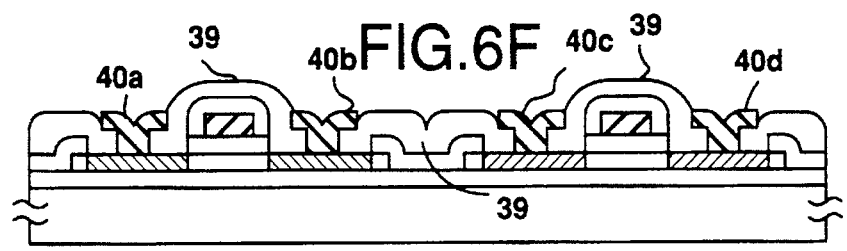
Figure 8A:
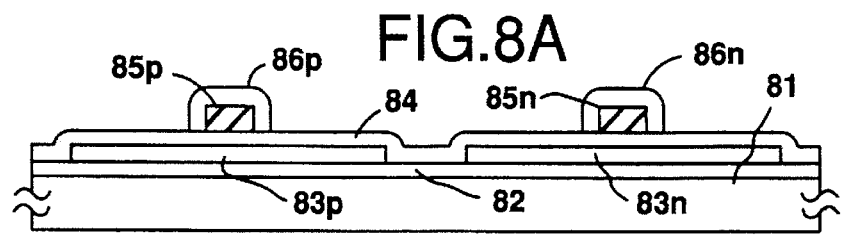
FIGS. 8A to 8F show process views explaining the TFT to be produced in Embodiment 5.
Figure 8B:
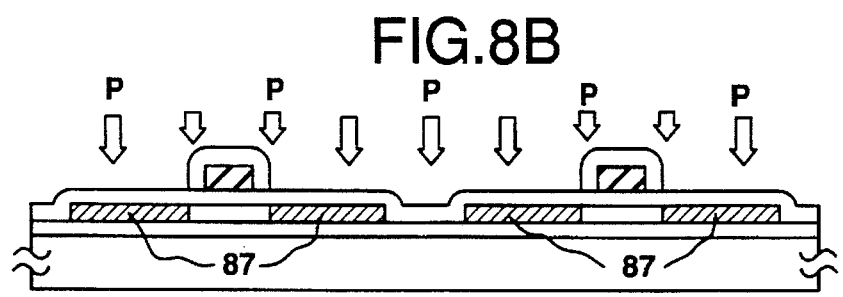
Figure 8C:
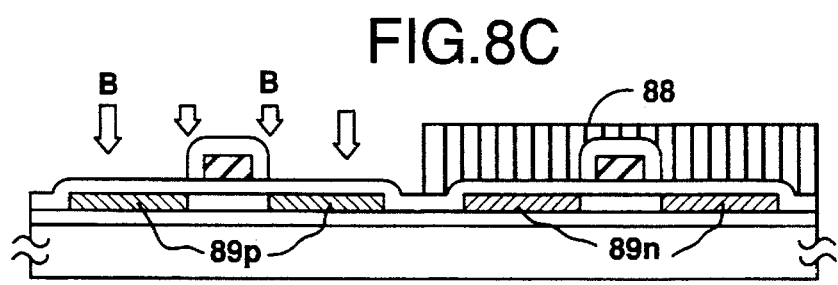
Figure 8D:
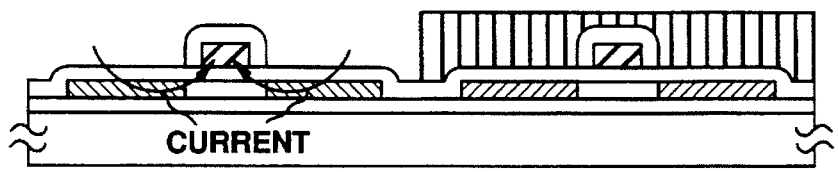
Figure 8E:
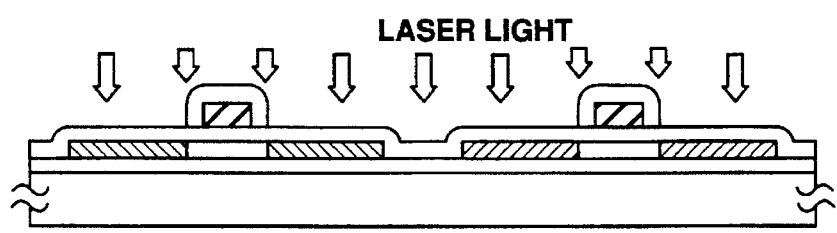
Figure 8F:
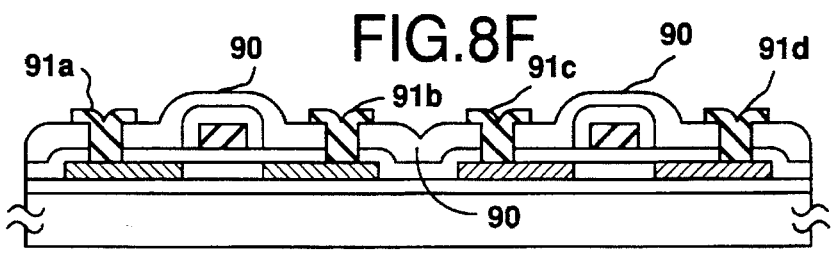

FIGS. 3A and 3B show the devices for conducting the current curing or anodic-oxidation. Precisely, an electrolytic bath 7 is filled with an electrolytic solution 8, and electrodes 10 made of a highly oxidation resistant material such as platinum, palladium or the like and substrates 9 are dipped in the electrolytic solution 8. For dipping the substrates 9, two methods may be employed. As illustrated in FIG. 3A, one is in a case wherein the substrates 9 themselves are directly dipped in the solution 8. The other as shown in FIG. 3B is in a case wherein the substrates 9 fixed to supports 9A are dipped in the solution 8. A positive or negative voltage is applied to terminals A and B that lead to the substrates 9 and the electrodes 10, respectively.

The following embodiments are to concretely demonstrate the present invention, which are not intended to restrict the scope of the present invention.

[Embodiment 1]

FIGS. 4A to 4F show sectional views of a TFT produced in this embodiment, explaining processes. In this embodiment, an N-channel TFT is formed. First, a base film 12 of silicon oxide having a thickness of 2000 Å is formed on a substrate (Corning 7059) 11, by sputtering. Next, an intrinsic (I-type) amorphous silicon film having a thickness of from 500 to 1500 Å, for example 1500 Å, is deposited thereon by plasma chemical vapor deposition (CVD), and then a silicon oxide film having a thickness of 200 Å is deposited thereon by sputtering. The amorphous silicon film is crystallized by annealing it in a nitrogen atmosphere at 600° C. for 48 hours.

After the crystallization process, the silicon film is patterned to form an island silicon region 13. Then, a silicon oxide film 14 having a thickness of 1000 Å is deposited thereon, by sputtering, as a gate insulating film. In the sputtering, a silicon oxide is used as the target. The temperature of the substrate during the sputtering is set at 200° to 400° C., for example 250° C., and the sputtering atmosphere (ambience) is comprised of oxygen and argon. A ratio of argon/oxygen is 0 to 0.5, for example 0.1 or less.

Subsequently, an aluminum film containing from 0.5 to 3%, for example 2%, of silicon is deposited at a thickness of from 1000 to 10000 Å, for example 5000 Å, by sputtering. It is desired that the process of forming the silicon oxide film and the process of forming the aluminum film are carried out continuously. The aluminum film is etched with a mixed acid containing phosphoric acid as the essential component to form a gate electrode 15. (See FIG. 4A)

Subsequently, the substrate (laminate) having the gate electrode 15 and the like is dipped in an ethylene glycol solution containing from 1 to 5% of tartaric acid, that had been neutralized with ammonia. A positive voltage is applied to the gate electrode, by which a current is passed therethrough and an anodic oxide (aluminum oxide) layer 16 is grown on the surface of the gate electrode 15. The potential of the gate electrode 15 is increased up to 200 to 300 V, for example, up to 250 V, initially at a rate of from 2 to 5 V/minutes, for example 4 V/minutes, and the increased potential is kept constant for 2 hours. The thickness of the anodic oxide to be formed is determined by the voltage applied. The thickness of the anodic oxide is preferably from 1000 to 5000 Å, especially preferably from 2000 to 3000 Å. In this embodiment, it is 2500 Å. (See FIG. 4B.)

Subsequently, an impurity (phosphorus) is introduced (doped) into the silicon region by plasma doping, using the gate electrode and the anodic oxide around it as the mask. As the doping gas, phosphine ($PH_3$) is used. The accelerated voltage for the doping is from 60 to 90 kV, for example 80 kV. The dose is from $1 \times 10^{15}$ to $8 \times 10^{15}$ cm$^{-2}$, for example $2 \times 10^{15}$ cm$^{-2}$. After the doping, N-type impurity regions 17a and 17b are formed. As can be seen from FIG. 4C, the impurity regions 17a and 17b and the gate electrode 16 are in an offset condition where they do not geometrically overlap with each other.

Again, the substrate (laminate) having the gate electrode 15 and the like is dipped in the ethylene glycol solution containing from 1 to 5% of tartaric acid, that had been neutralized with ammonia. A positive voltage is applied to the gate electrode 15, by which the current curing is effected. Since the gate electrode 15 is positive, the current flows along the direction shown by the arrows shown in FIG. 4D during the current curing. The potential of the gate electrode 15 is increased up to 30 to 80 V, for example, up to 60 V, initially at a rate of from 2 to 5 V/minutes, for example 4 V/minutes, and the increased potential is kept constant for one hour. (See FIG. 4D.)

Afterwards, laser light is irradiated to the substrate, to perform laser annealing. As the laser, a KrF excimer laser (having a wavelength of 248 nm and a pulse width of 20 nsec) is used, but this is not limitative. Any other lasers, such as an XeF excimer laser (having a wavelength of 353 nm), an XeCl excimer laser (having a wavelength of 308 nm), an ArF excimer laser (having a wavelength of 193 nm), etc., may also be used. Regarding the conditions for the laser radiation, the energy density is from 200 to 500 mJ/cm$^2$, for example 250 mJ/cm$^2$, and from 2 to 10 shots, for example 2 shots, are irradiated to every line or every region. During the laser radiation, the substrate is heated at 100° to 450° C., for example 250° C., to activate the impurity. (See FIG. 4E.)

Subsequently, a silicon oxide film 18 having a thickness of 6000 Å is formed as an interlayer insulator, by plasma CVD. Contact holes are formed through the interlayer insulator, and electrode wires 19a and 19b are formed therethrough in the source region and the drain region, respectively, of the TFT, using a metallic material such as a multi-layer film composed of titanium nitride and aluminum. Finally, the substrate is annealed in hydrogen ambience of one atmospheric pressure at 350° C. for 30 minutes. After the above mentioned processes, a thin film transistor is produced. (See FIG. 4F.)

A field effect mobility of the produced thin film transistor is from 70 to 100 cm$^2$/Vs at a gate potential of 10 V, and the threshold value thereof is from 2.5 to 4.0 V. The leak current is $10^{-13}$ A or less, when a voltage of −20 V is applied to the gate electrode.

This embodiment relates to the formation of an N-channel TFT and therefore the positive voltage is used in the current curing process. Needless to say, if a P-channel TFT is desired to be produced, the equivalent but negative voltage or a voltage of from −30 to −80 V may be used in the same process.

[Embodiment 2]

FIGS. 5A to 5F show sectional views of a TFT produced in this embodiment, explaining the processes. First, a base film 22 of a silicon oxide having a thickness of 2000 Å is formed on a substrate (Corning 7059) 21, by sputtering. Next, an intrinsic (I-type) amorphous silicon film having a thickness of from 200 to 1500 Å, for example 500 Å, is deposited thereon by plasma CVD. The silicon film is patterned to form an island silicon film 23. Then, the silicon region is crystallized by laser annealing. As the laser, a KrF excimer laser (having a wavelength of 248 nm) is used. The energy density of the laser is from 200 to 500 mJ/cm$^2$, for example 350 mJ/cm$^2$, and from 2 to 10 shots for example 2 shots, are irradiated to each region. During the laser radiation, the substrate is heated at 100° to 450° C., for example 350° C.

Next, using a raw material gas comprising tetraethoxysilane ($Si(OC_2H_5)_4$, hereinafter referred to as TEOS) and oxygen, a silicon oxide 24 having a thickness of 1000 Å is formed by plasma CVD, as the gate insulating film of the crystalline silicon TFT. As the raw material, trichloroethylene ($C_2HCl_3$) is used in addition to the above mentioned gas. Before the film forming, oxygen is introduced into the chamber at 400 SCCM to generate plasma therein, while the substrate is kept at 300° C., the total pressure is 5 Pa and the RF power is 150 W. This condition is maintained for 10 minutes. Afterwards, 300 SCCM of oxygen, 15 SCCM of TEOS and 2 SCCM of trichloroethylene are introduced into the chamber, to form the silicon oxide film. During the film forming, the temperature of the substrate is kept at 300° C., the RF power is 75 W and the total pressure is 5 Pa. After the film forming, hydrogen of 100 Torr is introduced into the chamber, and the substrate is subjected to hydrogen annealing at 350° C. for 35 minutes.

Subsequently, an aluminum film containing from 0.5 to 3%, for example 2%, of silicon is deposited at a thickness of from 1000 to 10000 Å, for example 5000 Å, by sputtering. The aluminum film is etched with a mixed acid containing phosphoric acid as the essential component, to form a gate electrode 25. (See FIG. 5A.)

Subsequently, the substrate (laminate) having the gate electrode 25 and the like is dipped in an ethylene glycol solution containing from 1 to 5% of tartaric acid, that had been neutralized with ammonia. A current is passed through the gate electrode 25 so that an anodic oxide (aluminum oxide) layer 26 is grown on the surface of the gate electrode 25. The thickness of the anodic oxide layer 17 is preferably from 1000 to 5000 Å, especially preferably from 2000 to 3000 Å. In this embodiment, it is 2500 Å. (See FIG. 5B.)

Next, using a photoresist, a mask 27 is formed. (See FIG. 5C.)

Subsequently, an impurity (phosphorus) is introduced (doped) into the silicon region by plasma doping, using the gate electrode and the anodic oxide around it as the mask. As the doping gas, phosphine ($PH_3$) is used. The accelerated voltage for the doping is from 60 to 90 kV, for example 80 kV. The dose is from $1 \times 10^{15}$ to $8 \times 10^{15}$ $cm^{-2}$, for example $2 \times 10^{15}$ $cm^{-2}$. As a result, N-type impurity regions 28a and 28b are formed. (See FIG. 5D.)

Afterwards, a part of the silicon oxide film 24 is etched using the mask 27, whereby the surface of the semiconductor regions 28a and 28b is exposed out. Next, lasers are irradiated to the substrate, to perform laser annealing. As the laser, a KrF excimer laser (having a wavelength of 248 nm and a pulse width of 20 nsec) is Used. The energy density of the laser is from 200 to 500 mJ/cm², for example 250 mJ/cm², and from 2 to 10 shots, for example 2 shots, are irradiated to each region. During the laser radiation, the substrate is heated at 100° to 450° C., for example 250° C. By the process, the impurity is activated. (See FIG. 5E.)

Again, the substrate with the gate electrode 25 and the like is dipped in the ethylene glycol solution containing from 1 to 5% of tartaric acid, that had been neutralized with ammonia. A positive voltage is applied to the gate electrode 25, to perform the current curing. Passing the current through the silicon film, especially the channel forming region (active region), causes the current curing process, as shown in FIGS. 2A and 2B. Hence, the recombination center in an interface between the insulating film and the silicon in the channel forming region, especially in the area to be pinched off in future, can be neutralized and removed. The potential of the gate electrode is increased up to 10 to 40 V, for example, up to 30 V, initially at a rate of from 2 to 5 V/minutes, for example 4 V/minutes, and the increased potential is kept constant for one hour.

Subsequently, a silicon oxide film 29 having a thickness of 6000 Å is formed as an interlayer insulator, by plasma CVD. Contact holes are formed through the interlayer insulator, and electrode wires 30a and 30b are formed therethrough in the source region and the drain region, respectively, of the TFT, using a metallic material such as a multi-layer film composed of titanium nitride and aluminum. Finally, the substrate is annealed in hydrogen of one atmospheric pressure at 350° C. for 30 minutes. After the above mentioned processes, a thin film transistor is produced. (See FIG. 5F.)

In this embodiment, the current curing is carried out after the activation of the impurity. During the current curing, the resistances of the source and the drain are greatly reduced and, additionally, the silicon oxide film 24 is already removed. Therefore, the resistance $R_3$ shown in FIG. 1A is substantially 0 (zero). As a result, the voltage for the current curing in this embodiment may be reduced to about a half or less of that needed in the case of Embodiment 1 because the sufficient current curing effect is obtained, as described above.

[Embodiment 3]

FIGS. 6A to 6F show sectional views of a TFT produced in this embodiment, explaining the processes. In this embodiment, a complementary TFT (CTFT) having both N-channel TFTs and P-channel TFTs which are formed on the same substrate is produced. First, a base film 32 of silicon oxide having a thickness of 2000 Å is formed on a substrate (Corning 7059) 31, by sputtering. Next, an intrinsic (I-type) amorphous silicon film having a thickness of from 500 to 1500 Å, for example 1500 Å, is deposited thereon by plasma CVD, and then a silicon oxide film having a thickness of 200 Å thereon by sputtering. The amorphous silicon film is crystallized by annealing it in a nitrogen atmosphere at 600° C. for 48 hours.

After the crystallization process, the silicon film is patterned to form island silicon regions 33p (for P-channel TFT) and 33n (for N-channel TFT). Then, a silicon oxide film 34 having a thickness of 1000 Å is deposited thereon by sputtering, as a gate insulating film. For the sputtering, a silicon oxide is used as the target. The temperature of the substrate during the sputtering is set at 200° to 400° C., for example 250° C., and the sputtering atmosphere is comprised of oxygen and argon at argon/oxygen of from 0 to 0.5, for example 0.1 or less.

Subsequently, an aluminum film containing from 0.5 to 3%, for example 2%, of silicon is deposited at a thickness of from 1000 to 10000 Å, for example 5000 Å, by sputtering. It is desired that the process of forming the silicon oxide film and the process of forming the aluminum film are carried out continuously. The aluminum film is etched with a mixed acid containing phosphoric acid as the essential component, to form gate electrodes 35p (for P-channel TFT) and 35n (for N-channel TFT).

Subsequently, the substrate with the gate electrodes 35p and 35n and the like is dipped in an ethylene glycol solution containing from 1 to 5% of tartaric acid, that had been neutralized with ammonia. A positive voltage is applied to the gate electrodes, and then anodic oxide (aluminum oxide) layers 36p and 36n are grown on the surfaces of the gate electrodes. The thickness of the anodic oxide is 2500 Å. (See FIG. 6A.)

Next, using a photoresist, a mask 37n is formed. Subsequently, an impurity (phosphorus) is introduced (doped) into the silicon region 33n for N-channel TFT by plasma doping, using the mask 37n as well as the gate electrode 35n and the anodic oxide 36n around it, as the mask. As the doping gas, phosphine (PH$_3$) is used. The accelerated voltage for the doping is from 60 to 90 kV, for example 80 kV. The dose is from $1\times10^{15}$ to $8\times10^{15}$ cm$^{-2}$, for example $2\times10^{15}$ cm$^{-2}$. After the doping, an N-type impurity region 38n is formed.

Again, the substrate is dipped in the ethylene glycol solution containing from 1 to 5% of tartaric acid, that had been neutralized with ammonia. A positive voltage is applied to the gate electrodes, to conduct the current curing. The potential of the gate electrodes is increased up to 30 to 80 V, for example, up to 60 V, initially at a rate of 4 V/minutes, and the increased potential is kept constant for one hour. (See FIG. 6B.)

During the process, the voltage is applied also to the gate electrode in the P-channel TFT. However, since the P-channel TFT is wholly covered with the insulating material, a desired voltage is not applied to the insulating film below the gate electrode. Accordingly, the P-channel TFT is not subjected to the current curing in this process. This is favorable to the P-channel TFT. This is because, if the positive voltage is applied to the gate insulating film of the P-channel TFT, its characteristics are decreased.

Afterwards, a part of the silicon oxide film 34 on the semiconductor region 33n is etched using the mask 37n, whereby the surface of the semiconductor region 33n is exposed out. As the etchant, 10% hydrofluoric acid solution is used. (See FIG. 6C.)

Next, using a photoresist, the N-channel TFT is covered with a mask 37p and then the semiconductor region 33p for P-channel TFT is exposed out. Then, an impurity (boron) is introduced into the silicon region 33p for P-channel TFT by plasma doping, using the mask 37p as well as the gate electrode 35p and the anodic oxide 36p around it, as the mask. As the doping gas, diborane (B$_2$H$_6$) is used. The accelerated voltage for the doping is from 40 to 80 kV, for example 65 kV. The dose is from $1\times10^{15}$ to $8\times10^{15}$ cm$^{-2}$, for example $5\times10^{15}$ cm$^{-2}$. After the doping, a P-type impurity region 38p is formed. Again, the substrate is dipped in the ethylene glycol solution containing from 1 to 5% of tartaric acid, that had been neutralized with ammonia, and this time a negative voltage is applied to the gate electrode, to conduct the current curing. The potential of the gate electrode is increased up to −30 to −80 V, for example, up to −60 V, initially at a rate of −4 V/minutes, and the increased potential is kept constant for one hour.

During the process, the voltage is applied also to the gate electrode in the N-channel TFT, like in the previous process. However, since the N-channel TFT is wholly covered with the insulating material, a desired voltage is not applied to the insulating film below the gate electrode.

Subsequently, the silicon oxide film 34 is etched using the mask. As the etchant, 10% hydrofluoric acid solution is used. (See FIG. 6D.)

Afterwards, laser is irradiated to the substrate (laminate), to perform laser annealing. As the laser, a KrF excimer laser (having a wavelength of 248 nm and a pulse width of 20 nsec) is used. The energy density of the laser is from 200 to 500 mJ/cm$^2$, for example 250 mJ/cm$^2$, and from 2 to 10 shots, for example 2 shots, are irradiated to each region. During the laser radiation, the substrate is heated at 100° to 450° C., for example 250° C. By the process, the impurities are activated. (See FIG. 6E.)

Subsequently, a silicon oxide film 39 having a thickness of 6000 Å is formed as an interlayer insulator, by plasma CVD. Contact holes are formed through the interlayer insulator, and electrode wires 40a, 40b, 40c and 40d are formed therethrough in the source regions and the drain regions of TFT, using a metallic material such as a multilayer film composed of titanium nitride and aluminum. Finally, the substrate is annealed in hydrogen of one atmospheric pressure at 350° C. for 30 minutes. After the above mentioned processes, a thin film transistor is produced. (See FIG. 6F.)

Using the thin film transistor thus formed, a shift register is constructed. The operation of the register is confirmed to be 11 MHz at a drain potential of 15 V and 20 MHz at the same of 18 V.

Where CTFT as produced in this embodiment is subjected to current curing, it will be general to separately form gate electrodes for the P-channel TFT and the N-channel TFT in order that a voltage is independently applied thereto. However, connection of the gate electrode of the N-channel TFT with that of the P-channel TFT is frequently required in the circuit of CTFT. Therefore, if the application of the voltage to these gate electrodes is separately conducted by independent lines, an additional pattern for connecting them later is needed.

This embodiment is characterized in that the difficulty in the independent applications of the voltage to the gate electrodes is removed by the masks 37p and 37n. These masks actually act also as the doping masks, and the formation of them does not increase the processes.

[Embodiment 4]

FIGS. 7A to 7F show sectional views of a TFT produced in this embodiment, explaining the processes. In this embodiment, a complementary TFT (CTFT) having both N-channel TFTs and P-channel TFTs on the same substrate is produced. First, a base film 62 of silicon oxide having a thickness of 2000 Å is formed on a substrate (Corning 7059) 61, by sputtering. Next, an intrinsic (I-type) amorphous silicon film having a thickness of from 500 to 1500 Å, for example 1500 Å, is deposited thereon by plasma CVD, and then a silicon oxide film having a thickness of 200 Å thereon by sputtering. The amorphous silicon film is crystallized by annealing it in a nitrogen atmosphere at 600° C. for 48 hours.

After the crystallization process, the silicon film is patterned to form island silicon regions 63p (for P-channel TFT) and 63n (for N-channel TFT). Then, a silicon oxide film 64 having a thickness of 1000 Å is deposited thereon by sputtering, as a gate-insulating film. For the sputtering, silicon oxide is used as the target. The temperature of the substrate during the sputtering is set at 200° to 400° C., for example 250° C., and the sputtering atmosphere is comprised of oxygen and argon at argon/oxygen of from 0 to 0.5, for example 0.1 or less.

Subsequently, an aluminum film containing from 0.5 to 3%, for example 2%, of silicon is deposited at a thickness of from 1000 to 10000 Å, for example 5000 Å, by sputtering. It is desired that the process of forming the silicon oxide film and the process of forming the aluminum film are carried out continuously. The aluminum film is etched with a mixed acid containing phosphoric acid as the essential component, to form gate electrodes 65p (for P-channel TFT) and 65n (for N-channel TFT) are formed.

Subsequently, the substrate with the gate electrodes 65p and 65n and the like is dipped in an ethylene glycol solution containing from 1 to 5% of tartaric acid, that had been neutralized with ammonia. A positive voltage is applied to the gate electrodes, and then anodic oxide (aluminum oxide) layers 66p and 66n are grown on the surfaces of the gate electrodes. The potential of the gate electrodes is increased up to 200 to 300 V, for example, up to 250 V, initially at a rate of from 2 to 5 V/minutes, for example 4 V/minutes, and the increased potential is kept constant for 2 hours. The thickness of the anodic oxide to be formed is determined by the voltage applied. The thickness of the anodic oxide is preferably from 1000 to 5000 Å, especially preferably from 2000 to 3000 Å. In this embodiment, it is 2500 Å. (See FIG. 7A.)

Subsequently, an impurity (phosphorus) is introduced (doped) into the silicon regions 63n and 63p by plasma doping, using the gate electrodes 65p and 65n and the anodic oxide films 66p and 66n around them, as the masks. As the doping gas, phosphine ($PH_3$) is used. The accelerated voltage for the doping is from 60 to 90 kV, for example 80 kV. The dose is from $1 \times 10^{15}$ to $8 \times 10^{15}$ cm$^{-2}$, for example $2 \times 10^{15}$ cm$^{-2}$. After the doping, N-type impurity regions 67 are formed. As can be seen from FIG. 7B, the impurity regions 67 and the gate electrodes 65p and 65n are in an offset condition where they do not geometrically overlap with each other.

Next, using a photoresist, a mask 68 is formed, thereby only the semiconductor region 63p for P-channel TFT is exposed out. Again, the substrate is dipped in the ethylene glycol solution containing from 1 to 5% of tartaric acid, that had been neutralized with ammonia. A negative voltage is applied to the gate electrode, to perform the current curing. Since the gate electrode is negative, the current flows along the direction shown by the arrows in FIG. 7C during the current curing. The potential of the gate electrode is increased up to −30 to −80 V, for example, up to −60 V, initially at a rate of −4 V/minutes, and the increased potential is kept constant for one hour.

During the process, the voltage is applied also to the gate electrode in the N-channel TFT, like in the previous process. However, since the N-channel TFT is wholly covered with the insulating material, a desired voltage is not applied to the insulating film below the gate electrode. Accordingly, the N-channel TFT is not subjected to the current curing in this process. That is, the current curing does not produce for the N-channel TFT. This is favorable to the N-channel TFT. This is because, if the negative voltage is applied to the gate insulating film of the N-channel TFT, its characteristics are deteriorated. (See FIG. 7C.)

Subsequently, an impurity (boron) is introduced into the silicon region 63p for P-channel TFT by plasma doping, using the mask 68 as well as the gate electrode 65p and the anodic oxide 66p around it, as the mask. As the doping gas, diborane ($B_2H_6$) is used. The accelerated voltage for the doping is from 40 to 80 kV, for example 65 kV. The dose is from $1 \times 10^{15}$ to $8 \times 10^{15}$ cm$^{-2}$, for example $5 \times 10^{15}$ cm$^{-2}$, which is more than the dose of phosphorus that had been doped previously. After the doping, P-type impurity regions 69p are formed, while N-type impurity regions 69n are formed in the N-channel region masked with the mask 68.

Afterwards, laser is irradiated to the substrate, to perform laser annealing. As the laser, a KrF excimer laser (having a wavelength of 248 nm and a pulse width of 20 nsec) is used, which, however, is not limitative. Any other lasers, such as an XeF excimer laser (having a wavelength of 353 nm), an XeCl excimer laser (having a wavelength of 308 nm), an ArF excimer laser (having a wavelength of 193 nm), etc., may also be used. Regarding the conditions for the laser radiation, the energy density of the laser is from 200 to 500 mJ/cm$^2$, for example 250 mJ/cm$^2$, and from 2 to 10 shots, for example 2 shots, are irradiated to each region. During the laser radiation, the substrate is heated at 100° to 450° C., for example 250° C. By the process, the impurities are activated. (See FIG. 7E.)

Subsequently, a silicon oxide film 70 having a thickness of 6000 Å is formed as an interlayer insulator, by plasma CVD. Contact holes are formed through the interlayer insulator, and electrode wires 71a, 71b, 71c and 71d are formed therethrough in the source region and the drain region, respectively, of the TFT, using a metallic material such as a multi-layer film composed of titanium nitride and aluminum. Finally, the substrate is annealed in hydrogen of one atmospheric pressure at 350° C. for 30 minutes. After the above mentioned processes, a thin film transistor is produced. (See FIG. 7F.)

The field effect mobility of the produced thin film transistor is from 70 to 100 cm$^2$/Vs (in N-channel TFT) and from 50 to 90 cm$^2$/Vs (in P-channel TFT) at a gate potential of 10 V, and the threshold value thereof is from 2.0 to 3.5 V (in N-channel TFT) and from −2.5 to 4.0 V (in P-channel TFT).

Using the produced thin film transistor, a shift register is constructed. The operation of the register is confirmed to be 11 MHz at a drain potential of 15 V and 20 MHz at the same of 18 V.

[Embodiment 5]

FIGS. 8A to 8F show sectional views of a TFT produced in this embodiment, explaining the processes. First, a base film 82 of silicon oxide having a thickness of 2000 Å is formed on a substrate (Corning 7059) 81, by sputtering. Next, an intrinsic (I-type) amorphous silicon film having a thickness of from 500 to 1500 Å, for example 500 Å, is deposited thereon by plasma CVD, and then this is patterned to form island silicon regions 83p (for P-channel TFT) and 83n (for N-channel TFT).

Next, the silicon regions are crystallized by laser annealing. As the laser, a KrF excimer laser (having a wavelength of 248 nm) is used. The energy density of the laser is from 200 to 500 mJ/cm$^2$, for example 350 mJ/cm$^2$, and from 2 to 10 shots, for example 2 shots, are applied to each region. During the laser radiation, the substrate is heated at 100° to 450° C., for example 350° C.

Next, using a raw material gas comprising tetraethoxysilane ($Si(OC_2H_5)_4$, hereinafter referred to as TEOS) and oxygen, a silicon oxide 84 having a thickness of 1000 Å is formed by plasma CVD, as the gate insulating film of the crystalline silicon TFTs. As the raw material, trichloroethylene ($C_2HCl_3$) is used in addition to the above mentioned gas. Before the film forming, oxygen is introduced into the chamber at a rate of 400 SCCM. Plasma is generated in the chamber in a case wherein the temperature of the substrate is 300° C., the total pressure is 5 Pa and the RF power is 150 W. This condition is maintained for 10 minutes. Afterwards, 300 SCCM of oxygen, 15 SCCM of TEOS and 2 SCCM of trichloroethylene are introduced into the chamber, to form the silicon oxide film. During the film forming, the temperature of the substrate is kept at 300° C., the RF power is 75 W and the total pressure is 5 Pa. After the film forming, hydrogen of 100 Torr is introduced into the chamber and then hydrogen annealing is conducted at 350° C. for 35 minutes.

Subsequently, an aluminum film containing from 0.5 to 3%, for example 2%, of silicon is deposited at a thickness of from 1000 to 10000 Å, for example 5000 Å, by sputtering. The aluminum film is etched to form gate electrodes 85p (for P-channel TFT) and 85n (for N-channel TFT) are formed.

Subsequently, the substrate with the gate electrode 85p and 85n and the like is dipped in an ethylene glycol solution containing from 1 to 5% of tartaric acid, that had been neutralized with ammonia. A positive voltage is applied to the gate electrodes so as to pass a current therethrough, and then anodic oxide (aluminum oxide) layers 86p and 86n are grown on the surfaces of the gate electrodes. The potential of the gate electrodes is increased up to 200 to 300 V, for example, up to 250 V, initially at a rate of from 2 to 5 V/minutes, for example 4 V/minutes, and the increased potential is kept constant for 2 hours. The thickness of the anodic oxide to be formed is determined by the voltage applied. The thickness of the anodic oxide is preferably from 1000 to 5000 Å, especially preferably from 2000 to 3000 Å. In this embodiment, it is 2500 Å. (See FIG. 8A.)

Subsequently, an impurity (phosphorus) is introduced into the silicon regions 83p and 83n by plasma doping, using the gate electrodes 85p and 85n and the anodic oxide films 86p and 86n as the masks. As the doping gas, phosphine ($PH_3$) is used. The accelerated voltage for the doping is from 60 to 90 kV, for example 80 kV. The dose is from $1 \times 10^{15}$ to $8 \times 10^{15}$ cm$^{-2}$, for example $2 \times 10^{15}$ cm$^{-2}$. After the doping, N-type impurity regions 87 are formed. (See FIG. 8B.)

Next, using a photoresist, a mask 88 is formed to expose out only the semiconductor region 83p for P-channel TFT. An impurity (boron) is introduced into the silicon region 83p for P-channel TFT by plasma doping, using the mask 88 as well as the gate electrode 85p and the anodic oxide 86p as the mask. As the doping gas, diborane ($B_2H_6$) is used. The accelerated voltage for the doping is from 40 to 80 kV, for example 65 kV. The dose is from $1 \times 10^{15}$ to $8 \times 10^{15}$ cm$^{-2}$, for example $5 \times 10^{15}$ cm$^{-2}$, which is more than the dose of phosphorus that had been doped previously. After the doping, P-type impurity regions 89p are formed, while N-type impurity regions 89n are formed in the N-channel region masked with the mask 88. (See FIG. 8C.)

Again, the substrate is dipped in the ethylene glycol solution containing from 1 to 5% of tartaric acid, that had been neutralized with ammonia. A negative voltage is applied to the gate electrode, to perform the current curing. Passing the current through the silicon film, especially the channel forming region (active region), produces the current curing process, as shown in FIGS. 2A and 2B. Hence, the recombination centers in an interface between the insulating film and the silicon in the channel forming region, especially in the area to be pinched off in future, are neutralized and removed. The potential of the gate electrode is increased up to −30 to −80 V, for example, up to −60 V, initially at a rate of −4 V/minutes, and the increased potential is kept constant for one hour. (See FIG. 8D.)

Afterwards, laser is irradiated to the substrate, to conduct laser annealing. As the laser, a KrF excimer laser (having a wavelength of 248 nm and a pulse width of 20 nsec) is used. The energy density of the laser is from 200 to 500 mJ/cm$^2$, for example 250 mJ/cm$^2$, and from 2 to 10 shots, for example 2 shots, are irradiated to each region. During the laser radiation, the substrate is heated at 100° to 450° C., for example 250° C. By the process, the impurities are activated. (See FIG. 8E.)

Subsequently, a silicon oxide film 90 having a thickness of 6000 Å is formed as an interlayer insulator, by plasma CVD. Contact holes are formed through the interlayer insulator, and electrode wires 91a, 91b, 91c and 91d are formed therethrough in the source region and the drain region, respectively, of the TFT, using a metallic material such as a multi-layer film composed of titanium nitride and aluminum. Finally, the substrate is annealed in hydrogen of one atmospheric pressure at 350° C. for 30 minutes. After the above mentioned processes, a thin film transistor is produced. (See FIG. 8F.)

[Embodiment 6]

FIGS. 9A to 9F show sectional views of a TFT produced in this embodiment, explaining the processes. First, a base film 102 of silicon oxide having a thickness of 2000 Å is formed on a substrate (Corning 7059) 101, by sputtering. Next, an intrinsic (I-type) amorphous silicon film having a thickness of from 500 to 1500 Å, for example 1500 Å, is deposited thereon by plasma CVD, and then a silicon oxide film having a thickness of 200 Å thereon by sputtering. The amorphous silicon film is crystallized by annealing it in a nitrogen atmosphere at 600° C. for 48 hours.

After the crystallization process, the silicon film is patterned to form island silicon regions 103p (for P-channel TFT) and 103n (for M-channel TFT). Then, a silicon oxide film 104 having a thickness of 1000 Å is deposited thereon by sputtering, as a gate insulating film. For the sputtering, silicon oxide is used as the target. The temperature of the substrate during the sputtering is set at 200° to 400° C., for example 250° C., and the sputtering atmosphere is comprised of oxygen and argon at argon/oxygen of from 0 to 0.5, for example 0.1 or less.

Subsequently, an aluminum film containing from 0.5 to 3%, for example 2%, of silicon is deposited at a thickness of from 1000 to 10000 Å, for example 5000 Å, by sputtering. The aluminum film is etched to form gate electrodes 105p (for P-channel TFT) and 105n (for N-channel TFT).

Subsequently, the substrate with gate electrodes 105p and 105n and the like is dipped in an ethylene glycol solution containing from 1 to 5% of tartaric acid, that had been neutralized with ammonia. A positive voltage is applied to the gate electrodes and then anodic oxide (aluminum oxide) layers 106p and 106n are grown on the surfaces of the gate electrodes. The potential of the gate electrodes is increased up to 200 to 300 V, for example, up to 250 V, initially at a rate of from 2 to 5 V/minutes, for example 4 V/minutes, and the increased potential is kept constant for 2 hours. The thickness of the anodic oxide to be formed is determined by the voltage applied. The thickness of the anodic oxide is preferably from 1000 to 5000 Å, especially preferably from 2000 to 3000 Å. In this embodiment, it is 2500 Å. (See FIG. 9A.)

Next, using a photoresist, a mask 107 is formed to expose out only the semiconductor region 103p for P-channel TFT. Again, the substrate is dipped in the ethylene glycol solution containing from 1 to 5% of tartaric acid, that had been neutralized with ammonia. A negative voltage is applied to the gate electrodes to perform the current curing. The potential of the gate electrodes is increased up to −70 to −200 V, for example, up to −120 V, initially at a rate of −4 V/minutes, and the increased potential is kept constant for one hour. In this embodiment, since the regions corresponding to the source and the drain of P-channel TFT are not doped, the resistance thereof is high. That is to say, the resistance $R_4$ shown in FIGS. 1A or 1B is high so that the voltage effect in these regions is large. Namely, the ratio of the voltage applied to the gate insulating film to the voltage $V_G$ applied to the gate electrodes is reduced so that this embodiment requires a higher voltage than that used in the Embodiments 4 and 5 (cases wherein the regions of the source and the drain of P-channel TFT are doped). (Sea FIG. 9B.)

Subsequently, an impurity (boron) is introduced into the silicon region 103p for P-channel TFT by plasma doping; using the mask 107 as well as the gate electrode 105p and the anodic oxide 106p as the mask. As the doping gas, diborane ($B_2H_6$) is used. The accelerated voltage for the doping is from 40 to 80 kV, for example 65 kV. The dose is from $1\times10^{15}$ to $8\times10^{15}$ cm$^{-2}$, for example $5\times10^{15}$ cm$^{-2}$. After the doping, P-type impurity regions 108p are formed. (See FIG. 9C.)

Next, the mask 107 is removed, and an impurity (phosphorus) is introduced into the silicon regions 103n and 103p by plasma doping, using the gate electrodes and the anodic oxide films around them as the masks. As the doping gas, phosphine (PH$_3$) is used. The accelerated voltage for the doping is from 60 to 90 kV, for example 80 kV. The dose is from $1\times10^{15}$ to $8\times10^{15}$ cm$^{-2}$, for example $2\times10^{15}$ cm$^{-2}$, which is less than the dose of boron doped previously. After the doping, N-type impurity regions 108n are formed. On the other hand, the P-channel TFT region 108p into which boron is introduced are left as P-type regions since the concentration of the introduced boron is larger than that of the introduced phosphorus in these regions. (See FIG. 9D.)

Afterwards, laser is irradiated to the substrate, to conduct laser annealing. As the laser, a KrF excimer laser (having a wavelength of 248 nm and a pulse width of 20 nsec) is used. The energy density of the laser is from 200 to 500 mJ/cm$^2$, for example 250 mJ/cm$^2$, and from 2 to 10 shots, for example 2 shots, are irradiated to each one. During the laser radiation, the substrate is heated at 100° to 450° C., for example 250° C. By the process, the impurities are activated. (See FIG. 9E.)

Subsequently, a silicon oxide film 109 having a thickness of 6000 Å is formed as an interlayer insulator, by plasma CVD. Contact holes are formed through the interlayer insulator, and electrode wires 110a, 110b, 110c and 110d are formed therethrough in the source region and the drain region, respectively, of the TFT, using a metallic material such as a multi-layer film composed of titanium nitride and aluminum. Finally, the substrate is annealed in hydrogen of one atmospheric pressure at 350° C. for 30 minutes. After the above mentioned processes, a thin film transistor is produced. (See FIG. 9F.)

According to the present invention, a large amount of TFTs may be subjected to current curing in an industrial scale for mass production. The above mentioned embodiments have shown only the processes (A), (B) and (D) that have been mentioned hereinabove, but it will be obvious to one skilled in the art that the process (C) may be carried out in the same manner. By the current curing, the characteristics of TFTs are improved, as so mentioned above. The economical advantage of the present invention is significant, as the industrial scale current curing of a large amount of CTFT circuits has become possible by the present invention. Thus, the present invention is an industrially useful one.

While the invention has been described in detail and with reference to specific embodiments thereof, it will be apparent to one skilled in the art that various changes and modifications can be made therein without departing from the spirit and scope thereof.

What is claimed is:

1. A method for forming a thin film transistor, comprising the steps of:

forming a non-single crystalline semiconductor island region on a substrate;

forming an insulating film covering the non-single crystalline semiconductor island region;

forming a gate electrode comprising an anode-oxidizable material on the insulating film to obtain a first laminate;

dipping the first laminate in an electrolytic solution and applying an electric current to the gate electrode as a positive electrode to form an anodic oxide film on a surface of the gate electrode;

introducing an impurity into the non-single crystalline semiconductor island region using the gate electrode and the anodic oxide film as a mask to obtain a second laminate; and dipping the second laminate in the electrolytic solution and applying a positive or negative voltage to the gate electrode.

2. The method according to claim 1, further comprising the step of irradiating laser or intense light equivalent to the laser after the impurity is introduced, to activate the impurity.

3. The method according to claim 1, wherein when the thin film transistor has an N-channel, the positive voltage is applied to the gate electrode.

4. The method according to claim 1, wherein when the thin film transistor has a P-channel, the negative voltage is applied to the gate electrode.

5. A method for forming thin film transistors, comprising the steps of:

forming at least two non-single crystalline semiconductor island regions on a substrate;

forming an insulating film covering the non-single crystalline semiconductor island regions;

forming gate electrodes each comprising an anode-oxidizable material on the insulating film to obtain a first laminate;

dipping the first laminate in an electrolytic solution and applying an electric current to the gate electrode as positive electrodes to form anodic oxide films on surfaces of the gate electrodes;

introducing an impurity into at least one of the non-single crystalline semiconductor island regions over which an insulating material has not been formed to obtain a second laminate;

dipping the second laminate in the electrolytic solution and applying a positive or negative voltage to the gate electrodes; and removing the insulating material.

6. The method according to claim 5, further comprising the step of irradiating laser or intense light equivalent to the laser after the impurity is introduced, to activate the impurity.

7. The method according to claim 5, wherein when the thin film transistor has an N-channel, the positive voltage is applied to the gate electrode.

8. The method according to claim 5, wherein when the thin film transistor has a P-channel, the negative voltage is applied to the gate electrode.

9. A method for forming thin film transistors, comprising the steps of:

forming on a substrate at least one first semiconductor island region for an N-channel thin film transistor and at least one second semiconductor island region for a P-channel thin film transistor;

forming an insulating film covering the first and second semiconductor island regions;

forming gate electrodes each comprising an anode-oxidizable material on the insulating film to obtain a first laminate;

dipping the first laminate in an electrolytic solution and applying an electric current to the gate electrode as positive electrodes to form anodic oxide films on surfaces of the gate electrodes;

forming a first mask comprising an insulating material over one of the first and second semiconductor island regions;

introducing an impurity into the other one of the first and second semiconductor island regions over which the first mask has not formed to obtain a second laminate;

dipping the second laminate in the electrolytic solution and applying a positive or negative voltage to the gate electrodes;

removing the first mask;

forming a second mask comprising an insulating material over the other one of the first and second semiconductor island regions over which the first mask was not formed;

introducing an impurity into the one of the first and second island regions over which the second mask has not formed to obtain a third laminate;

dipping the third laminate in the electrolytic solution and applying to the gate electrodes a voltage having a polarity which is opposite to a polarity of the voltage applied to the gate electrodes after the second laminate is dipped in the electrolytic solution; and removing the second mask.

10. The method according to claim 9, further comprising the step of irradiating laser or intense light equivalent to the laser after the impurity is introduced, to activate the impurity.

11. The method according to claim 9, wherein When the first mask or the second mask is formed over the first non-single crystalline semiconductor island region, the negative voltage is applied to the gate electrodes.

12. The method according to claim 9, wherein when the first mask or the second mask is formed over the second non-single crystalline semiconductor island region, the positive voltage is applied to the gate electrodes.

13. A method for forming thin film transistors, comprising the steps of:

forming on a substrate at least one first non-single crystalline semiconductor island region for an N-channel thin film transistor and at least one second non-single crystalline semiconductor island region for a P-channel thin film transistor;

forming an insulating film covering the first and second non-single crystalline semiconductor island regions;

forming gate electrodes each comprising an anode-oxidizable material on the insulating film to obtain a first laminate;

dipping the first laminate in an electrolytic solution and applying an electric current to the gate electrode as positive electrodes to form anodic oxide films on surfaces of the gate electrodes;

doping an impurity for providing N-conductivity type into the first and second non-single crystalline semiconductor island regions;

forming a mask comprising an insulating material over one of the first non-single crystalline semiconductor island regions to obtain a second laminate;

dipping the second laminate in the electrolytic solution; and applying a negative voltage to the gate electrodes.

14. The method according to claim 13, further comprising the step of doping an impurity for providing P-conductivity type into the second non-single crystalline semiconductor island region after the mask is formed and before the second laminate is dipped.

15. The method according to claim 14, further comprising the step of irradiating laser or intense light equivalent to the laser after the impurity is doped, to activate the impurity.

16. The method according to claim 13, further comprising the step of doping an impurity for providing P-conductivity type into the second non-single crystalline semiconductor island region after the negative voltage is applied to the gate electrodes.

17. The method according to claim 16, further comprising the step of irradiating laser or intense light equivalent to the laser after the impurity is doped, to activate the impurity.

18. A method for forming thin film transistors, comprising the steps of:

forming on a substrate at least one first non-single crystalline semiconductor island region for an N-channel thin film transistor and at least one second non-single crystalline semiconductor island region for a P-channel thin film transistor;

forming an insulating film covering the first and second non-single crystalline semiconductor island regions;

forming gate electrodes each comprising an anode-oxidizable material on the insulating film to obtain a first laminate;

dipping the first laminate in an electrolytic solution and applying an electric current to the gate electrode as positive electrodes to form anodic oxide films on surfaces of the gate electrodes;

forming a mask comprising an insulating material overlying the first non-single crystalline semiconductor island regions to obtain a second laminate;

dipping the second laminate in the electrolytic solution;

applying a negative voltage to the gate electrodes; and doping an impurity for providing N-conductivity type into the first and second non-single crystalline semiconductor island regions.

19. The method according to claim 16, further comprising the step of doping an impurity for providing P-conductivity type into the second non-single crystalline semiconductor island region after the mask is formed and before the second laminate is dipped.

20. The method according to claim 19, further comprising the step of irradiating laser or intense light equivalent to the laser after the impurity is doped, to activate the impurity.

21. The method according to claim 16, further comprising the step of doping an impurity for providing P-conductivity type into the second non-single crystalline semiconductor island region after the negative voltage is applied to the gate electrodes and before the impurity for providing N-conductivity type is doped into the first and second non-single crystalline semiconductor regions.

22. The method according to claim 21, further comprising the step of irradiating laser or intense light equivalent to the laser after the impurity is doped, to activate the impurity.

* * * * *